(12) United States Patent
Nakamura et al.

(10) Patent No.: US 9,625,494 B2
(45) Date of Patent: Apr. 18, 2017

(54) CURRENT DETECTION RESISTOR (71) Applicant: KOA CORPORATION, Ina-shi, Nagano (JP)

(72) Inventors: Keishi Nakamura, Ina (JP); Koichi Hirasawa, Ina (JP); Kenji Kameko, Ina (JP)

(73) Assignee: KOA CORPORATION, Ina-shi (JP)

( * ) Notice: Subject to any disclaimer, the term of this patent is extended or adjusted under 35 U.S.C. 154(b) by 130 days.

(21) Appl. No.: 14/423,907

(22) PCT Filed: Aug. 21, 2013

(86) PCT No.: PCT/JP2013/072235
§ 371 (c)(1),
(2) Date: Feb. 25, 2015

(87) PCT Pub. No.: WO2014/038372
PCT Pub. Date: Mar. 13, 2014

(65) Prior Publication Data
US 2015/0212115 A1  Jul. 30, 2015

(30) Foreign Application Priority Data
Sep. 7, 2012  (JP) .................. 2012-196702

(51) Int. Cl.
H01C 1/148  (2006.01)
G01R 1/20  (2006.01)
(Continued)

(52) U.S. Cl.
CPC ............ *G01R 1/203* (2013.01); *G01R 15/14* (2013.01); *G01R 19/0092* (2013.01); *H01C 1/14* (2013.01); *H01C 1/148* (2013.01); *H01C 3/02* (2013.01)

(58) Field of Classification Search
CPC ...................................................... H01C 1/148
(Continued)

(56) References Cited

U.S. PATENT DOCUMENTS 2,708,701 A * 5/1955 Viola ..................... G01R 1/203
324/126
9,378,873 B2 * 6/2016 Yoshioka ............... H01C 1/144
(Continued)

FOREIGN PATENT DOCUMENTS

JP  58-155823 U  10/1983
JP  2-94269 A  4/1990
(Continued)

OTHER PUBLICATIONS

International Search Report dated Nov. 19, 2013 issued in application No. PCT/JP2013/072235.

*Primary Examiner* — Kyung Lee
(74) *Attorney, Agent, or Firm* — Westerman, Hattori, Daniels & Adrian, LLP (57) ABSTRACT Provided is a current detection resistor that is small and that inhibits influence of the skin effect due to high frequency current. The resistor includes a resistor body (11) and at least a pair of electrodes (12), wherein the resistor body (11) is configured in a pillar-shape having diameter of 4 mm or less disposed between the electrodes. Each of the electrodes (12) is made to be longer in the direction in which the electrodes are placed and longer than twice the distance between the electrodes, which sandwich the resistor body. Further, each of electrodes (12) is square pillar-shaped, and the resistor body is fixed to roughly to center of the electrode in cross-section.

3 Claims, 10 Drawing Sheets (51) Int. Cl.
  *H01C 1/14*    (2006.01)
  *H01C 3/02*    (2006.01)
  *G01R 15/14*   (2006.01)
  *G01R 19/00*   (2006.01)

(58) Field of Classification Search
  USPC .......................................................... 338/332
  See application file for complete search history.

(56) References Cited

U.S. PATENT DOCUMENTS

| | | | | |
|---|---|---|---|---|
| 2009/0195348 A1* | 8/2009 | Smith | ................... | H01C 1/148 338/332 |
| 2012/0229247 A1* | 9/2012 | Yoshioka | ............... | G01R 1/203 338/49 |
| 2014/0097933 A1* | 4/2014 | Yoshioka | ............... | H01C 1/144 338/332 |
| 2014/0370754 A1* | 12/2014 | Kameko | ................. | H01C 1/14 439/620.01 |
| 2015/0226768 A1* | 8/2015 | Nakamura | ......... | G01R 19/0092 324/126 |

FOREIGN PATENT DOCUMENTS

| | | |
|---|---|---|
| JP | 2002-57009 A | 2/2002 |
| JP | 2009-216620 A | 9/2009 |
| WO | 2011/068205 A1 | 6/2011 |

\* cited by examiner

CURRENT DETECTION RESISTOR

TECHNICAL FIELD

The present invention relates to current detection resistors, and particularly relating to current detection resistors suitable for detecting high frequency currents.

BACKGROUND ART

The resistor has been used in electronic equipments for power supply control, particularly for measuring direct current electric power. The resistor is superior in current detection accuracy, and small in temperature drift, and even if a large current is applied, excessive heat generation is not caused. Thus, the resistor has been used in a field, where low resistance is required. For example, a resistor consisting of plate-shaped configuration has been proposed (see laid-open Japanese patent publication 2002-57009).

Recently, complex electric power control that uses inverter devices etc. has been adopted in electronic equipments for energy saving and for high efficiency. Then, high accuracy detection of high frequency currents is desired in the field of power source control etc. However, in case of using the resistor having plate-shaped configuration, it is not suitable for high accuracy current detection, because skin effect may appear comparatively from stage of low frequency. That is, because biased current distribution in the resistor body is caused by skin effect and effective area where current flows decreases, and then resistance of the resistor changes. Thus, regarding to currents including high frequency components, an accurate current detection becomes difficult in the resistor, which has been disclosed in the above-mentioned reference.

On the other hand, hall sensors etc. are used in general for measuring high-frequency currents. However, miniaturization of equipments is desired, and there is a problem that it cannot satisfy the demand of miniaturization of equipments enough by current detection with the hall sensors etc.

SUMMARY OF INVENTION

Technical Problem

The invention has been made basing on above-mentioned circumstances. Therefore object of the invention is to provide a current detection resistor that is small and that inhibits influence of the skin effect of the high frequency current.

Solution to Problem

The resistor of the invention includes a resistor body and at least a pair of electrodes, wherein the resistor body is configured in a pillar-shape having diameter of 4 mm or less disposed between the electrodes. Each of the electrodes is made to be longer in the direction in which the electrodes are placed and longer than twice the distance between the electrodes, which sandwich the resistor body. Further, each of electrodes is square pillar-shaped, and the resistor body is fixed to roughly to center of the electrode in cross section.

According to the invention, by making the resistor body thin diameter, resistance change by skin effect when high frequency current being applied, is inhibited, then current detection of high accuracy becomes possible even for currents including high frequency components. Since, each of electrodes is square pillar-shaped, and is made to be longer in the direction in which the electrodes are placed, then surface mounting can be easy, and mounting area on circuit pattern can be easily secured, and heat radiation can be improved.

BRIEF DESCRIPTION OF DRAWINGS

FIG. 1(a) is a perspective view, FIG. 1(b) is a cross-sectional view along AA line of FIG. 1(c), FIG. 1(c) is a plan (bottom) view, and FIG. 1(d) is left and right side views, of the resistor of first embodiment of the invention.

FIG. 3(a) is a perspective view, and FIG. 3(b) is a cross-sectional view, of the resistor of third embodiment of the invention.

FIG. 4(a) is a perspective view, FIG. 4(b) is left and right side views, FIG. 4(c) is a plan (bottom) view, FIG. 4(d) is a cross-sectional view along BB line of FIG. 4(c), FIG. 4(e) is a front (back) view, and FIG. 4(f) is a cross-sectional view looking along CC arrow direction of FIG. 4(e), of the resistor according to forth embodiment of the invention.

DESCRIPTION OF EMBODIMENTS

Embodiments of the invention will be described below with referring to FIG. 1 through FIG. 15. Like or corresponding parts or elements will be denoted and explained by same reference characters throughout views.

Figure 1:
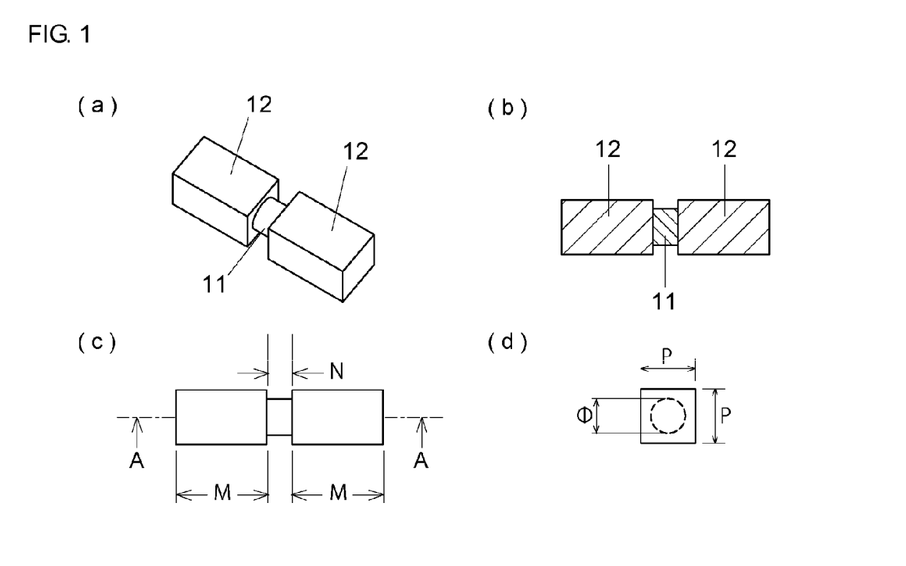

FIG. 1 shows structures of the resistor of first embodiment of the invention. The resistor includes a resistor body 11 and at least a pair of electrodes 12. The resistive alloy material such as Cu—Mn—Ni system alloy and Cu—Ni system alloy etc., which are generally used for the resistor, can be used for resistor body 11. As for electrodes 12, Cu etc. that is metal material of high electric conductivity, is used.

The resistor body 11 is configured to be a pillar-shape having diameter of 4 mm or less disposed between the electrodes 12. By making the resistor body thin diameter, resistance change by skin effect when high frequency current being applied, is inhibited, then current detection of high accuracy becomes possible for currents including high frequency components in some degree. That is, as to current detection resistor, in which detection of direct current is assumed to be basic, decrease of current path by skin effect is not substantially caused in some degree of high frequency current, current detection of high accuracy still being possible as well as direct current. Further, though it is possible to adopt square-pillar resistor body, if diameter is same, it is preferable to adopt circularly pillar-shaped one for inhibiting the skin effect.

As shown in FIG. 1, there is a step difference at joint portion between resistor body 11 and electrode 12. Therefore, because voltage detection terminal can be fixed to end face of electrode 12 on a side, where resistor body 11 is joined, high accuracy current detection can be possible basing on effective resistance. Each of electrodes 12 is square pillar-shaped, and the resistor body is fixed to roughly to center of the electrode in cross-section. Because of adopting square pillar-shaped electrode, it is easy for surface mounting and it is convenient to handle because there is no upper and lower directionality.

Each of electrodes 12 is made to be longer in direction in which electrodes are placed, and longer than twice the distance between the electrodes, which sandwich the resistor body. Then mounting area on circuit pattern can be easily secured, and heat radiation can be improved. Because diameter of resistor body 11 is small, then heat radiation of resistor body 11 becomes important for securing durability. And, electrode 12 has a cross-sectional area that is larger than the cross-sectional area of resistor body 11. Because, current path is configured to be gradually narrower from wiring pattern to electrode 12, and to resistor body 11, even when a large current is measured, an excessive load concentration on the resistor body can be inhibited.

Further, length of resistor body 11 is smaller than 1.5 times the diameter of the resistor body. That is, diameter of resistor body is made to be thinner to be 4 mm or less, and length thereof is shortened. Then, the resistor becomes suitable for detecting large currents of high frequency, and can achieve low resistance and miniaturization. Since, diameter of resistor body 11 is thin, it becomes strength poverty if it is too long.

Next, resistance and size of the resistors will be described upon specific examples. Resistance of the product is designed to be 0.1 mΩ or 0.2 mΩ. Assuming designed resistance being 0.2 mΩ and using Cu—Mn—Ni system alloy of cross-section being circle-shaped, and when diameter φ is 1 mm, length N becomes 0.36 mm, when diameter φ is 2 mm, length N becomes 1.42 mm, and when diameter φ is 3 mm, length N becomes 3.2 mm. That is, length N of the resistor body is made to be length that is shorter than 1.5 times diameter φ.

In case that when diameter φ of the resistor body is 2 mm, length N becomes 1.42 mm (that is, in case of resistance is 0.2 mΩ), length M of electrode 12 in direction in which the electrodes are placed, is set to be 5 mm, and width of electrode P is set to be 3 mm. By adopting these sizes, excellent frequency characteristics of resistance and heat dissipation can be achieved in good balance.

Figure 2:
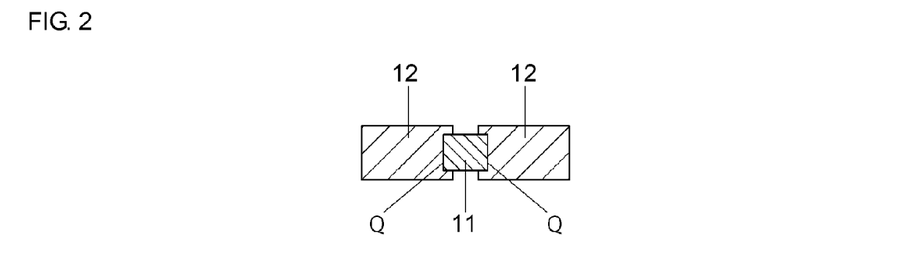
FIG. 2 is a cross-sectional view of the resistor of second embodiment of the invention.

FIG. 2 shows the resistor of second embodiment of the invention. Difference point from first embodiment is that concave portion Q on electrode 12a is provided at abutting face with resistor body, and end portion of resistor body 11 is fit into the concave portion and fixed. Therefore, positioning of resistor body becomes easy and joint between resistor body and electrode can be formed more easily.

Figure 3:
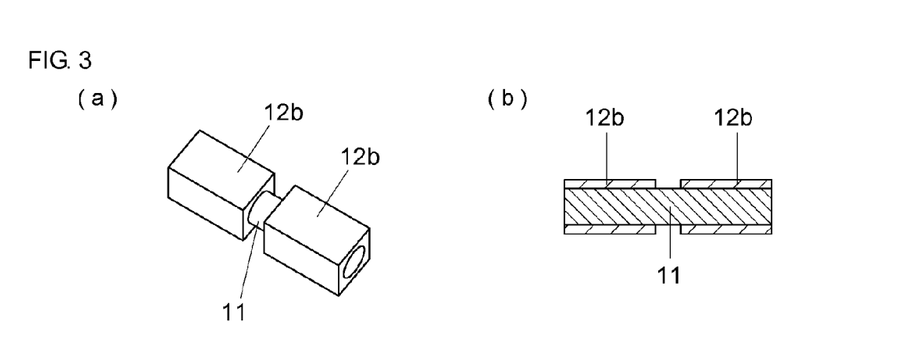

FIG. 3 shows the resistor of third embodiment of the invention. In the embodiment, electrode 12b is formed to be like the pipe, and the resistor has the structure that both end portions of thin resistor body 11 is penetrated through the electrode 12b. In the embodiment, by making diameter of resistor body 11 thin, resistance variation according to skin effect when high frequency current flowing can be inhibited. And, since the resistor has the structure that resistor body penetrates through inside of electrode 12b, application of swaging processing becomes possible, as mentioned later, and application of thermal fitting also can be possible. Here, thermal fitting is a method that expanding a hole of electrode like the pipe by applying heat, inserting resistor body into the hole and cooling, and then electrode and resistor body becoming closely contacted and fixed by the electrode like the pipe shrinking.

Figure 4:
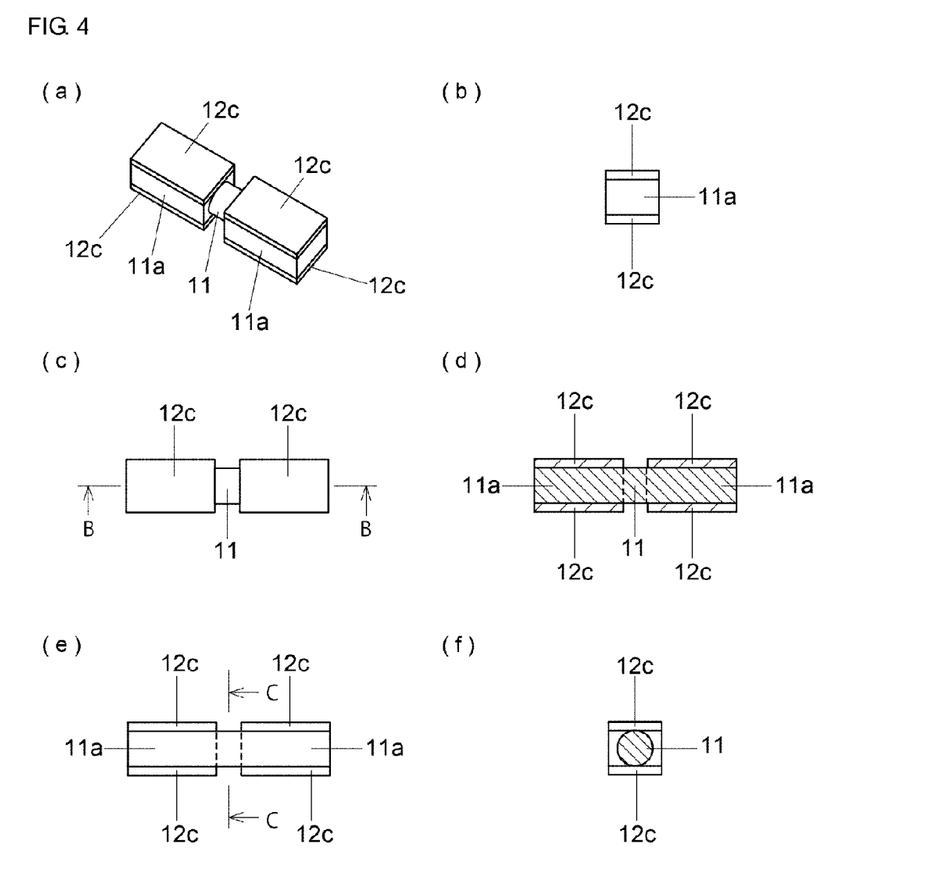

FIG. 4 shows the resistor of fourth embodiment of the invention. In the embodiment, the resistor body is configured by columnar resistor body 11 at central portion and flat resistance bodies 11a at both ends thereof. Plate-shaped electrode 12c is provided at both upper and lower surfaces of flat resistor body 11a. Therefore, the structure that has thin columnar resistor body at central portion and square pillar electrodes at both ends thereof is common with above-mentioned embodiments. In the embodiment, by having square pillar electrode 12c, advantages such as easy surface mounting and improvement of heat radiation are common with above-mentioned embodiments.

Figure 5:
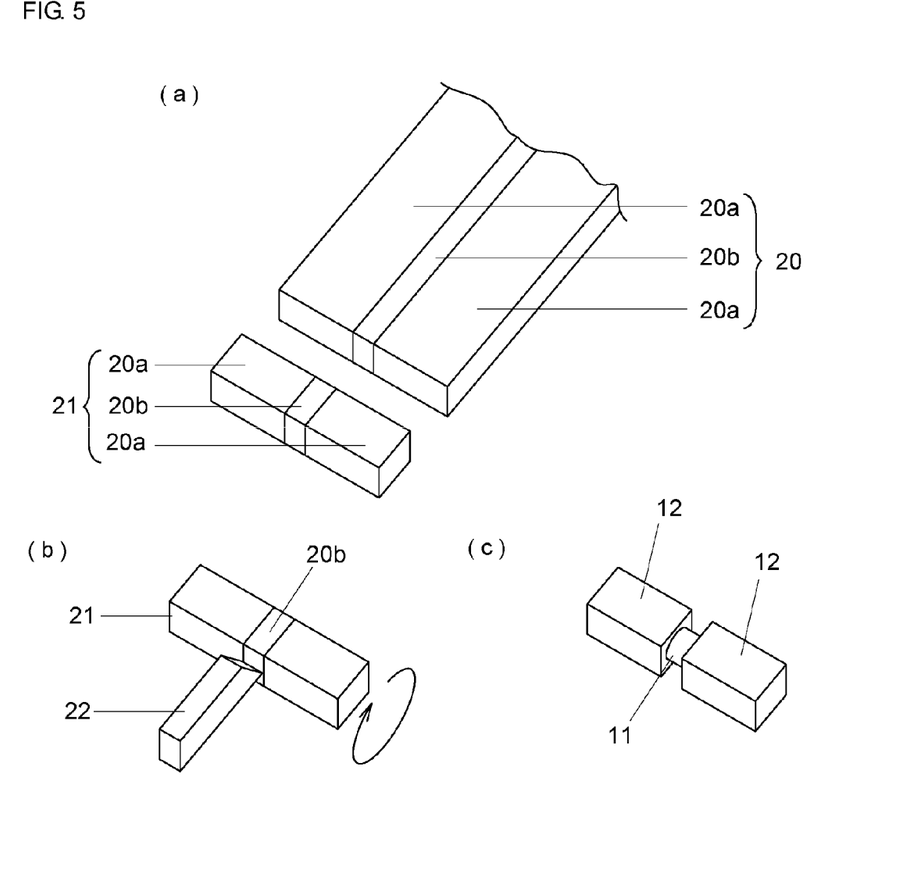
FIG. 5 is a perspective view, which shows manufacturing process of the resistor of first embodiment of the invention.

FIG. 5 shows manufacturing method of the resistor of first embodiment of the invention. First, strip material 20, which clad-bonds strip material for electrode 20a, strip material for resistor 20b, and strip material for electrode 20a, is prepared as shown in (a). Strip material 20 may be formed by welding such as laser beam welding after preparing strip material for electrode 20a, strip material for resistor 20b, and strip material for electrode 20a respectively. After then, strip material 20 is cut by press etc. into rectangular pieces of material; each corresponds to a piece of resistor.

Next, both end portions of rectangular piece of material 21, which has been cut to, are held by tool, and rotated. By pushing cutting tool to strip material for resistor 20b, it is cut to form resistor body 11, which has cross section of circle. A portion of strip material for electrode 20a becomes to form electrode 12 as it is, by matching it to size of electrodes when cutting strip material 20 to form rectangular piece of material 21. Further, metal processing distortion, which has been generated by cutting strip material for resistor 20b, can be removed by heat-treating at 200 to 600° C. And, if necessary, resistance is adjusted.

Figure 6A:
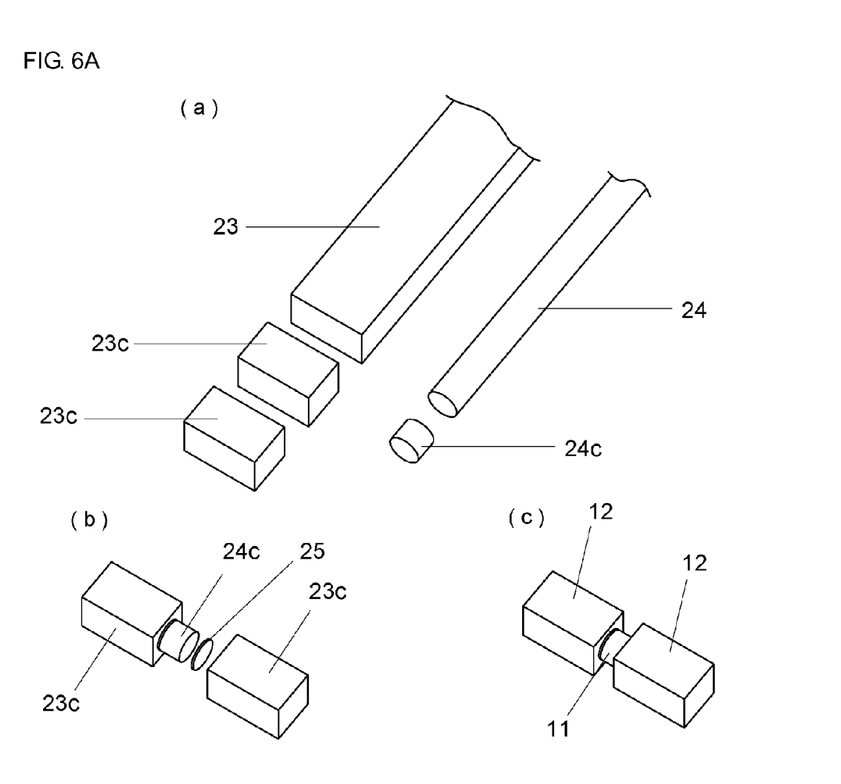
FIG. 6A is a perspective view, which shows modified manufacturing process thereof.

FIG. 6A shows variation of manufacturing method of resistor of first embodiment of the invention. First, strip material for electrode 23, which has cross section of rectangular, and wire rod for resistor 24, which has cross section of circle, are prepared. The strip material 23 is cut by press etc. so as to match to size of electrode 12 to form electrode chip 23c. As well, wire rod 24 is cut, so as to match to size of resistor body 11 to form resistor body chip 23c.

Next, as shown in (b), one piece of resistor body chip 24c is placed between two pieces of electrode chip 23c. In the case, wax material 25 intervenes at interface between electrode chip 23c and resistor body chip 24c. Then, by heating to 600 to 900° C. according to the wax material, joint by the wax material is formed. As a result, resistor of first embodiment of the invention shown in (c) is completed. Further, resistance is adjusted if necessary.

Figure 6B:
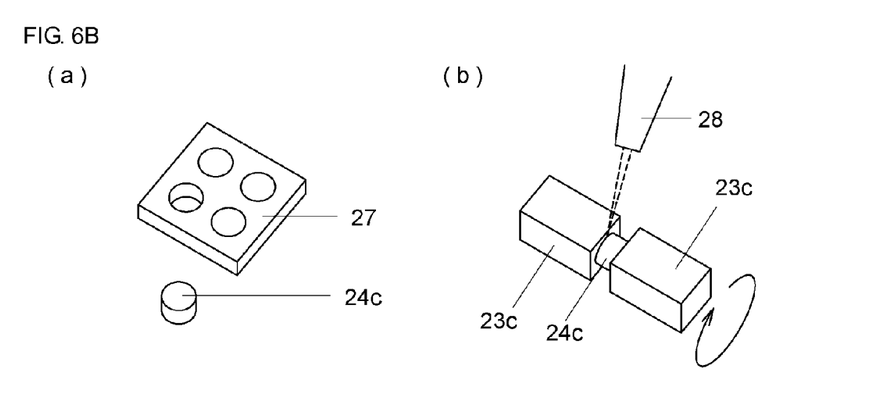
FIG. 6B is a view, which shows modified manufacturing process of the resistor body and welding method thereof.

FIG. 6B (a) shows variation of forming resistor body chip 24c. A resistive material sheet 27 that has thickness corresponding to length of resistor body 11 in axial direction (electrodes placed direction), is prepared. Then, by piercing with press, resistor body chip 24c, which has required diameter and required length in axial direction, can be obtained.

FIG. 6B (c) shows variation of bonding method using wax material. In the example, resistor body chip 24c and electrode chips 23c are joined by laser welding with using laser beam irradiation device 28. Further, not limiting to the laser welding, various welding methods such as electron beam welding etc. can be adopted.

Figure 7:
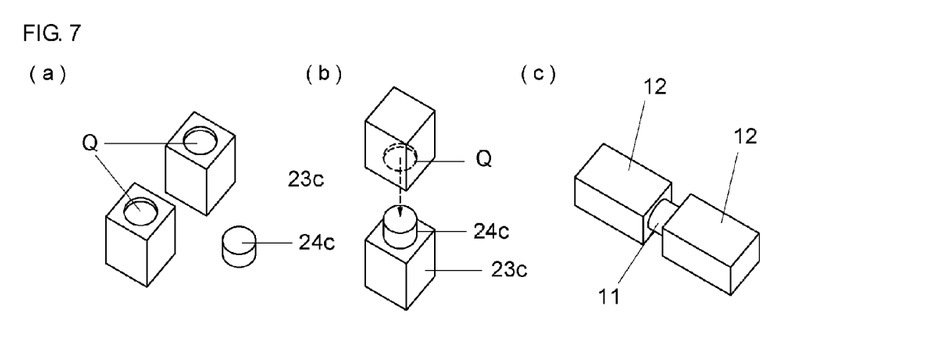
FIG. 7 is a perspective view, which shows manufacturing process of the resistor of second embodiment of the invention.

FIG. 7 shows manufacturing method of the resistor of second embodiment of the invention. As shown in (a), concave portion Q is formed on electrode chip 23c, which is formed of electrode strip material (see FIG. 6A). And, resistor chip 24c is put into the concave portion Q as shown in (b). Electrode chips 23c and resistor chip 24c may be joined by pressure bonding, or laser welding, or wax bonding, where wax material is deposited beforehand in concave portion Q. As a result, the resistor of second embodiment of the invention (see FIG. 2) is completed as shown in (c).

Figure 8:
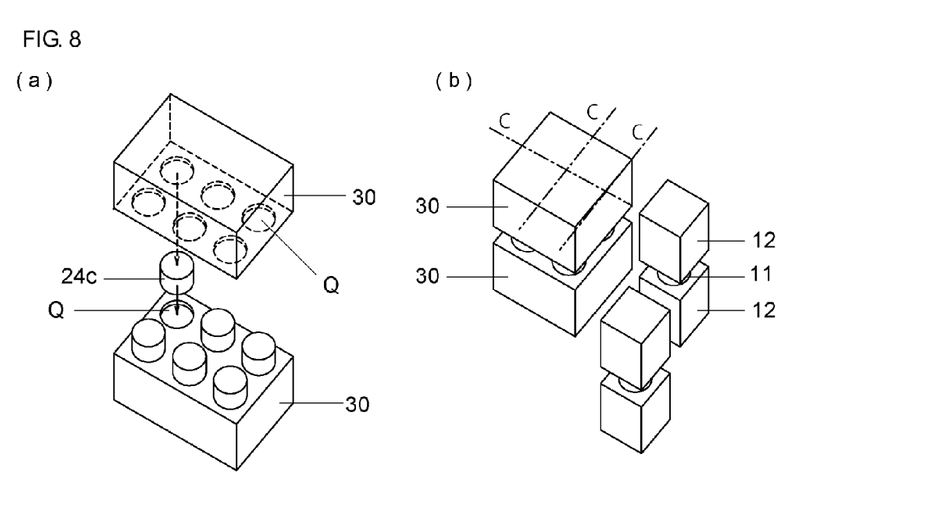
FIG. 8 is a perspective view, which shows modified manufacturing process shown above.

FIG. 8 shows variation of manufacturing method of the resistor of second embodiment of the invention. The embodiment relates to manufacturing method, where a lot of pieces is processed at one time. As shown in (a), electrode material sheet 30 having thickness M (see FIG. 1(c)), which corresponds length of the electrode (in axial direction), is prepared. Concave portions Q are regularly formed on electrode material sheet 30. And, one end of a plural of resistor chips 24c is put into concave portions Q on lower electrode material sheet 30, and another end of resistor chips 24c is put into concave portions Q on upper electrode material sheet 30. And, then these are fixed by pressure bonding etc.

As shown in (b), electrode material sheets 30 are cut off along cutting line C, so as to locate resistor chip 24c at the center, and so as to make electrode width P (see FIG. 1(d)). As a result, the resistor of second embodiment of the invention is completed (see FIG. 2).

Figure 9:
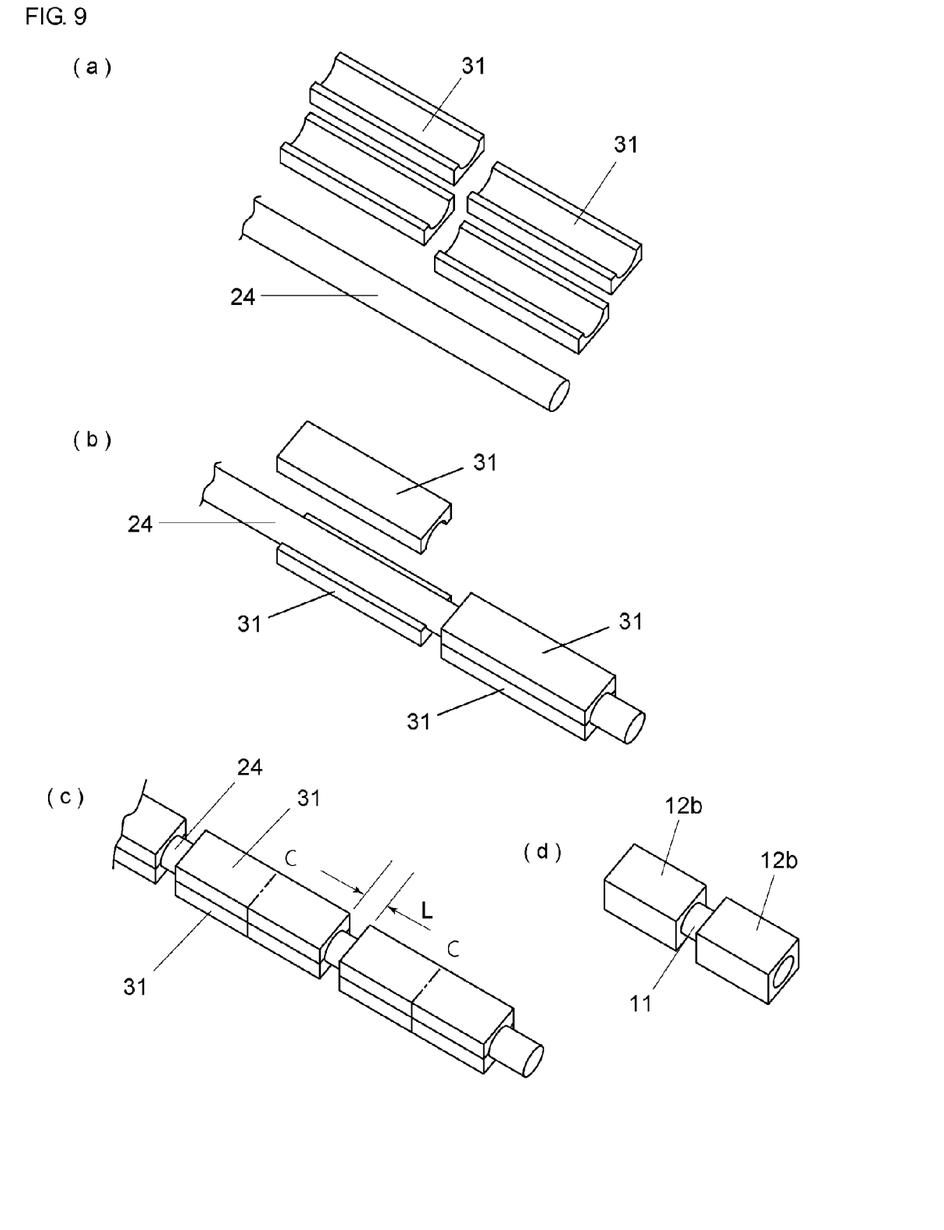
FIG. 9 is a perspective view, which shows manufacturing process of the resistor of third embodiment of the invention.

FIG. 9 shows manufacturing method of the resistor of third embodiment of the invention. As shown in (a), resistive wire rod 24 of long length having diameter of resistor body 11 to be manufactured, and rectangular electrode material 31 having semicircle concave portion in cross-section thereof are prepared. Here, diameter in the semicircle concave portion coincides with the diameter of the resistive wire rod 24.

And, as shown in (b), resistive wire rod 24 is inserted between two pieces of electrode materials 31. And, two pieces of electrode materials themselves, and electrode material 31 and resistive wire rod 24 are bonded by applying heat and pressure etc. At the time, the joint can be stabilized by applying heat.

Resistive wire rod 24 of long length is inserted between two electrode materials 31 as a set, and a plural of sets is formed along the wire rod. Here, separation L between adjacent sets is important. Resistance of the resistor is determined by the separation L. And, as shown in (c), the sets are cut away along cutting line C. As a result, as shown in (d), the resistor of third embodiment of the invention is completed (see FIG. 3).

Figure 10:
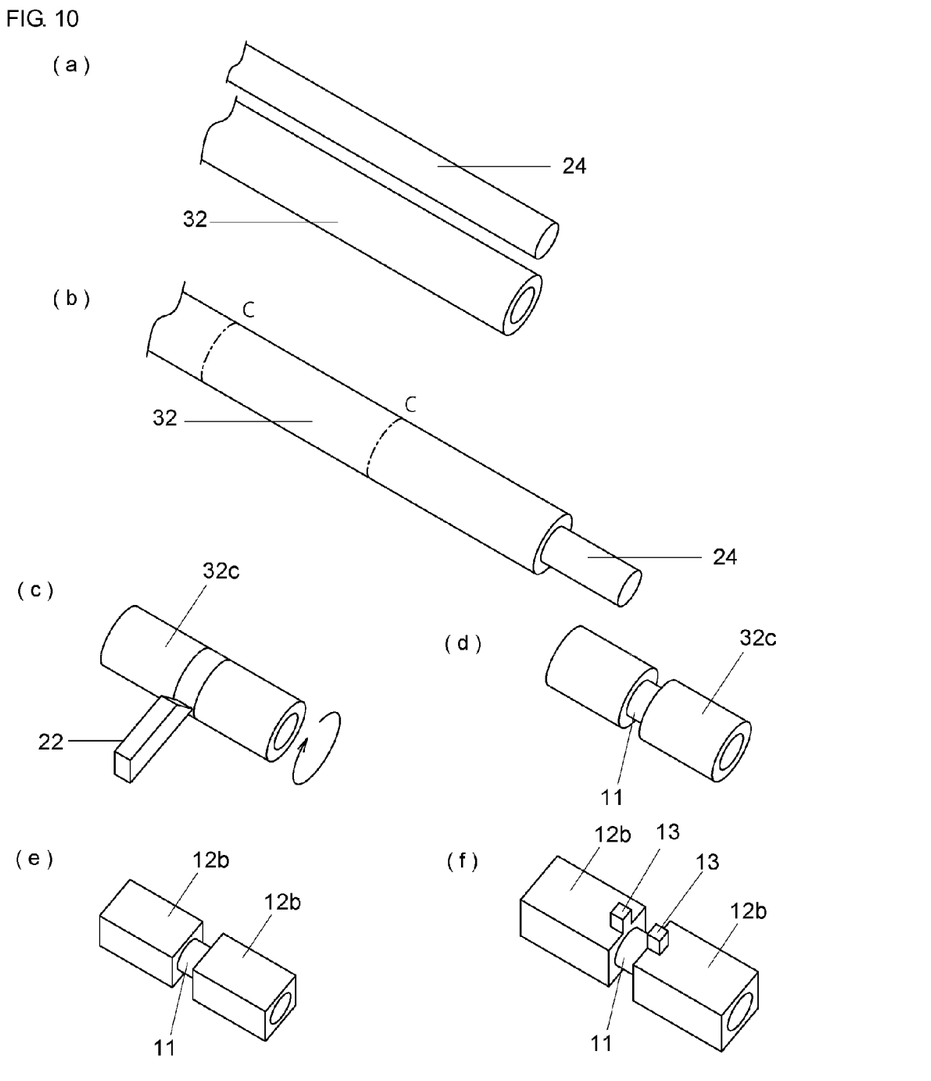
FIG. 10 is a perspective view, which shows modified manufacturing process shown above.

FIG. 10 shows variation of manufacturing method of the resistor of third embodiment of the invention. First, as shown in (a), resistive wire rod 24 of long length and electrode material like the pipe 32 of long length are prepared. And, as shown in (b), resistive wire rod 24 is inserted through inside of pipe-state electrode material 32, and they are bonded by applying pressure from outside (so-called swaging processing). Next, they are cut away along cutting line C to be separated into pieces 32c, each corresponding to one piece of the resistor.

Next, as shown in (c), both end portions of the piece 32c are held with tool, and this is rotated with pushing cutting tool 22 to central portion of the piece 32c, and this portion is cut away. Then, resistor body layer is exposed and resistor body 11, in which cross section becomes circle, is formed (see (d)). Further, forming flat face on surface of electrode 32c by pressing or forging, the resistor of third embodiment is completed (see FIG. 3). Further, after processing electrode portion to be square, cutting process for exposing resistor body may be carried out.

Further, when forging electrode 12b to be square pillar, convex portion 13, which becomes taking out position of voltage detection terminal, may be formed.

Figure 11:
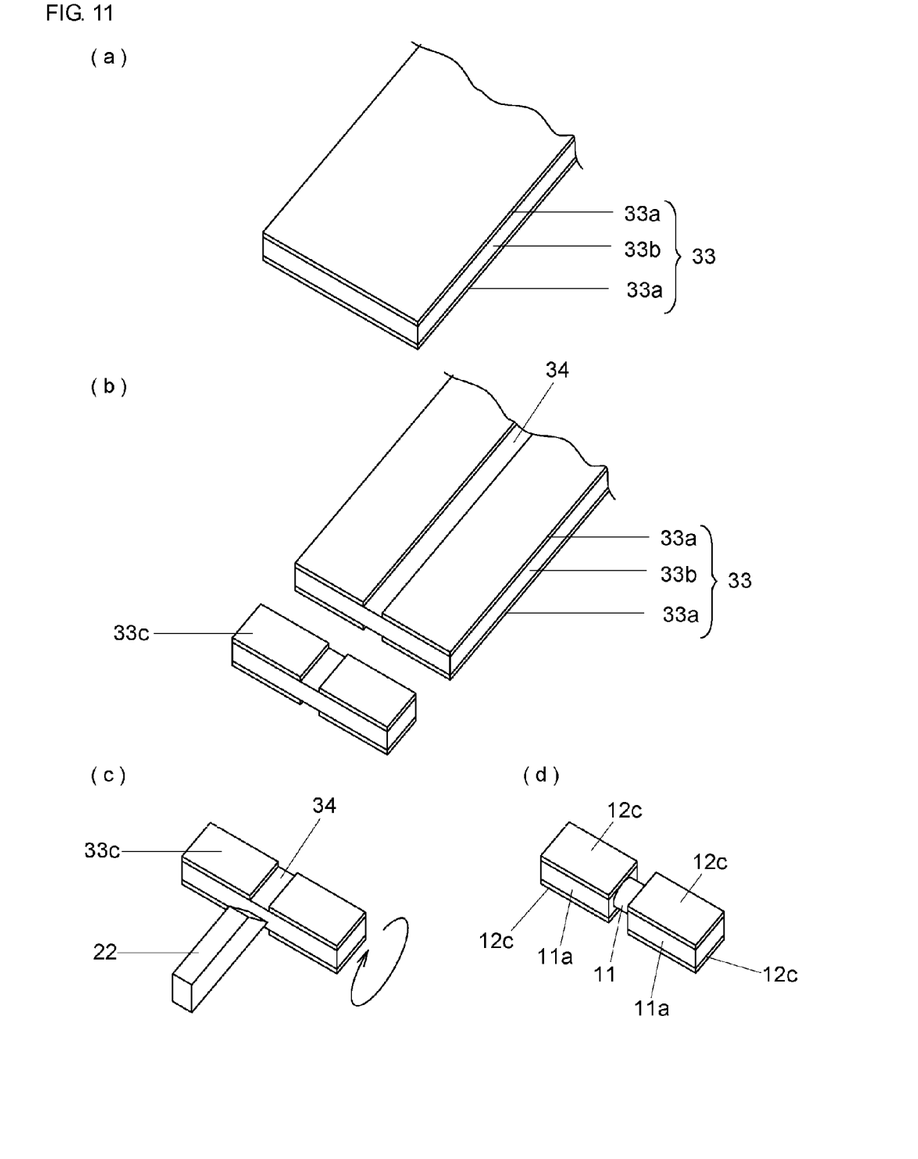
FIG. 11 is a perspective view, which shows manufacturing process of the resistor of forth embodiment of the invention.

FIG. 11 shows manufacturing method of the resistor of fourth embodiment of the invention. First, as shown in (a), clad material 33 of long length having resistive material sheet 33b sandwiched between two layers of electrode sheet 33a is prepared. Next, as shown in (b), electrode material seat 33a is cut in center portion of cladding material 33 to form groove 34, where resistance material seat 33b is exposed. As a result, electrode material sheet 33a of clad material 33 is cut away at center portion and separated to left and right portion. Groove 34 is similarly formed on back side of clad material 33. And, clad material 33 is cut and separated into pieces 33c corresponding to one piece of resistor.

Next, as shown in (c), both end portions of piece 33c are held with tool, and this is rotated while pushing cutting tool 22 to groove 34, and this portion is cut away to form resistor body 11, in which cross section becomes circle. As a result, as shown in (d), the resistor of fourth embodiment of the invention can be formed (see FIG. 4). The resistor has resistor body, which comprises columnar resistor body 11 at center and flat resistor bodies 11a at both ends thereof, and plate-shaped electrode 12c is provided on both upper and lower surfaces of flat resistor body 11a.

Figure 12:
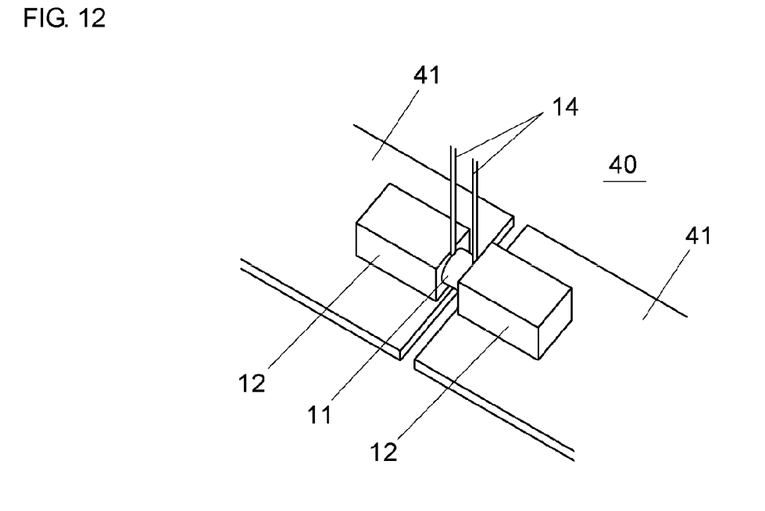
FIG. 12 is a perspective view, which shows mounting process of the resistor of the invention.

FIG. 12 shows an example of mounting the resistor of the invention. For instance, circuit pattern 41 is disposed on aluminum substrate 40. The resistor that has columnar resistor body 11 between rectangular electrodes 12 is fixed to circuit pattern 41 with solder by surface mounting. Voltage detection terminals 14 are taken out on the electrode 12 at vicinity of joint interface with the resistor body.

Figure 13:
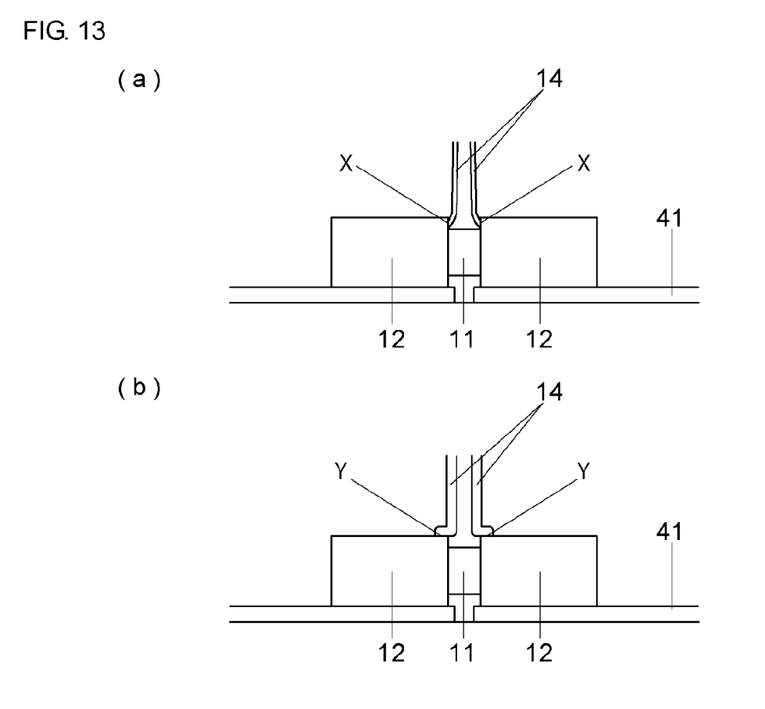
FIG. 13 is a view, which shows arrangement examples of the voltage detection terminals of FIG. 12.

FIG. 13 shows take-out position of the voltage detection terminal in the example. In case (a), since there is a step between outer surfaces of resistor body 11 and electrode 12, take-out position of the voltage detection terminal 14 is located at surface X on electrode 12, where surfaces X of electrodes 12 sandwich resistor body 11. As a result, since influence for resistance of electrode is almost not contained, it is possible to make it close to current detection based on resistive element of actual resistor body unlimitedly. Then current detection with high accuracy becomes possible.

In case (b), take-out position of voltage detection terminal 14 is located at surface Y, that is, on upper surface of electrode 12, at vicinity of corner of side surface fixing resistor body 11 and upper surface of electrode 12. As a result, since influence of resistance of electrode is almost not contained, then current detection with high accuracy becomes possible similarly.

Figure 14:
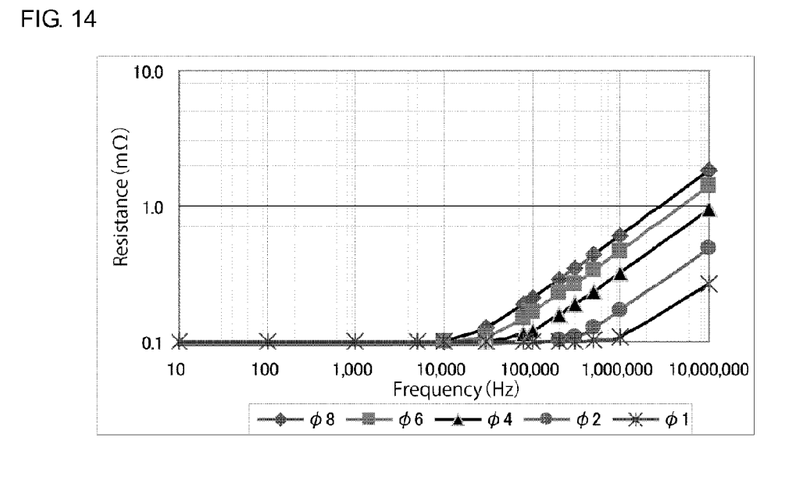
FIG. 14 is a graph, which shows frequency characteristics of resistance according to the resistor of the invention.

FIG. 14 shows frequency characteristics of resistance upon resistors of the invention. Frequency characteristics has been studied upon resistor bodies having diameter of "φ8" (diameter of resistor body 8 mm) through "φ1" (diameter of resistor body 1 mm). As a result, as to fat size resistor having diameter of "φ8" (diameter of resistor body 8 mm), influence of skin effect begins to appear by frequency 10 KHz or more, and resistance rises. As to comparatively thin size resistor having diameter of "φ4" (diameter of resistor body 4 mm), influence of skin effect begins to appear by frequency 100 KHz or more, and resistance rises. As to thinnest size resistor having diameter of "φ1" (diameter of resistor body 1 mm), influence of skin effect begins to appear by frequency 1000 KHz or more, and resistance rises. From these results, it is understood that influence by skin effect by high-frequency current can be controlled if resistor having diameter of "φ4" (diameter of resistor body 4 mm) or less.

Figure 15:
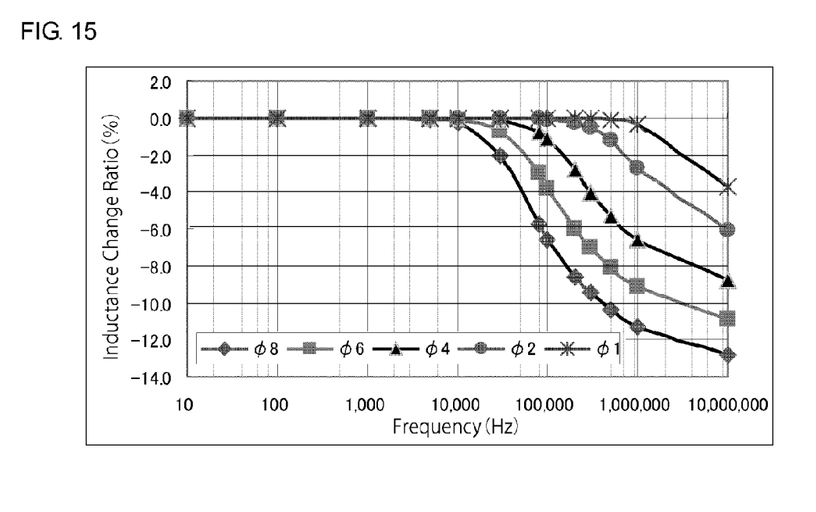
FIG. 15 is a graph, which shows frequency characteristics of inductance change ratio of the resistor of the invention.

FIG. 15 shows frequency characteristics of inductance change ratio upon resistors of the invention. When inductance rises, big error will be caused particularly in detection of high frequency current. As to inductance change ratio as well as resistance change ratio, when diameter of resistor body thinner, it is understood to be able to use for high frequency area as current detection resistor.

Although embodiments of the invention has been explained, however the invention is not limited to above embodiments, and various changes and modifications may be made within scope of the technical concept of the invention.

INDUSTRIAL APPLICABILITY

The invention can be suitably used for current detection resistor, particularly for current detection resistor that measures high frequency current.

The invention claimed is:

1. A current detection resistor, comprising
a resistor body; and
at least a pair of electrodes,
wherein the resistor body is configured in a pillar-shape having a diameter of 4 mm or less disposed between the electrodes,
wherein the resistor has a step difference at a joint portion between the resistor body and the electrode, and
wherein a length of the resistor body is smaller than 1.5 times the diameter of the resistor body.

2. The current detection resistor according to claim 1, wherein each of the electrodes is made to be longer in direction in which the electrodes are placed, and longer than twice the distance between the electrodes, which sandwich the resistor body.

3. The current detection resistor according to claim 1, wherein each of the electrodes is square pillar-shaped, and the resistor body is fixed to roughly to center of the electrode in cross-section.

* * * * *